(12) United States Patent
Lee et al.

(10) Patent No.: US 12,336,391 B2
(45) Date of Patent: Jun. 17, 2025

(54) DISPLAY APPARATUS HAVING A GROOVE FORMED IN A PROTRUSION OF A PLANARIZATION LAYER

(71) Applicant: LG Display Co., Ltd., Seoul (KR)

(72) Inventors: Joonsuk Lee, Paju-si (KR); SeJune Kim, Paju-si (KR); Sangpil Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 427 days.

(21) Appl. No.: 17/733,307

(22) Filed: Apr. 29, 2022

(65) Prior Publication Data
US 2022/0352263 A1   Nov. 3, 2022

(30) Foreign Application Priority Data

Apr. 30, 2021   (KR) .................. 10-2021-0056432

(51) Int. Cl.
*H10K 59/122* (2023.01)
*H10K 59/121* (2023.01)

(52) U.S. Cl.
CPC ......... *H10K 59/122* (2023.02); *H10K 59/121* (2023.02)

(58) Field of Classification Search
CPC ... H10K 59/121; H10K 59/122; H10K 59/353
See application file for complete search history.

(56) References Cited

U.S. PATENT DOCUMENTS

| 10,644,075 B2 | 5/2020 | Gong et al. | |
| 2015/0060820 A1* | 3/2015 | Takagi | H10K 71/60 438/46 |
| 2019/0181188 A1* | 6/2019 | Youn | H10K 59/122 |
| 2020/0373366 A1* | 11/2020 | Sim | H10K 50/818 |

FOREIGN PATENT DOCUMENTS

| KR | 10-2018-0013226 A | 2/2018 |
| KR | 10-2019-0003240 A | 1/2019 |
| KR | 20190068102 A | 6/2019 |
| KR | 20200048890 A | 5/2020 |

OTHER PUBLICATIONS

Office Action dated Dec. 18, 2024 issued in corresponding Korean Patent Application No. 10-2021-0056432.

* cited by examiner

*Primary Examiner* — Herve-Louis Y Assouman
*Assistant Examiner* — Christopher M Roland
(74) *Attorney, Agent, or Firm* — Morgan, Lewis & Bockius LLP (57) ABSTRACT

A display apparatus is provided, which includes a substrate having a plurality of subpixels, a planarization layer provided on the substrate, including a first area in which protrusions are formed and a second area positioned between the protrusions, a first electrode provided on the planarization layer, a light emitting layer provided on the first electrode, a second electrode provided on the light emitting layer, and a first groove provided on an upper portion of the protrusion, wherein the protrusion is provided between two adjacent subpixels, and the first electrode covers an entire surface of the second area and a portion of the protrusion.

16 Claims, 6 Drawing Sheets

DISPLAY APPARATUS HAVING A GROOVE FORMED IN A PROTRUSION OF A PLANARIZATION LAYER

CROSS-REFERENCE TO RELATED APPLICATIONS

This application claims the benefit of the Korean Patent Application No. 10-2021-0056432 filed on Apr. 30, 2021, which are hereby incorporated by reference as if fully set forth herein.

BACKGROUND

Technical Field of the Invention

The present disclosure relates to a display apparatus.

Discussion of the Related Art

With the advancement of the information age, the demand for a display apparatus for displaying an image has increased with various forms. Therefore, various types of display apparatuses such as a liquid crystal display (LCD), a plasma display panel (PDP) and an electroluminescence display (ELD) have been recently used. The electroluminescence display apparatus may include a display apparatus such as an organic light emitting display (OLED) and a quantum-dot light emitting display (QLED).

Among the display apparatuses, the electroluminescence display apparatus is a self-light emitting type and has advantages in that a viewing angle and a contrast ratio are more excellent than those of the liquid crystal display (LCD). Also, since the electroluminescence display apparatus does not require a separate backlight, it is advantageous that the electroluminescence display apparatus is able to be thin and lightweight and has low power consumption. Furthermore, the electroluminescence display apparatus has advantages in that it may be driven at a low direct current voltage, has a fast response speed and especially has a low manufacturing cost.

Meanwhile, when the electroluminescence display apparatus is provided in a top emission type in which light is emitted to an upper direction, all areas of a substrate may be theoretically used as light emission areas.

However, in order to prevent a short between pixel electrodes provided in each light emission area, adjacent pixel electrodes may be formed to be spaced apart from each other as much as a predetermined distance. Therefore, a problem occurs in that a size of the light emission area is reduced to reduce an aperture ratio of the display apparatus.

SUMMARY

Accordingly, embodiments of the present disclosure are directed to a display apparatus that substantially obviates one or more of the problems due to limitations and disadvantages of the related art.

An aspect of the present disclosure is to provide an electroluminescence display apparatus that has an increased aperture ratio by minimizing an interval between adjacent pixel electrodes.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises a substrate having a plurality of subpixels, a planarization layer provided on the substrate, including a first area in which protrusions are formed and a second area positioned between the protrusions, a first electrode provided on the planarization layer, a light emitting layer provided on the first electrode, a second electrode provided on the light emitting layer, and a first groove provided on an upper portion of the protrusion, wherein the protrusion is provided between two adjacent subpixels, and the first electrode covers an entire surface of the second area and a portion of the protrusion.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, example embodiments of the present disclosure will be described in detail with reference to the accompanying drawings.

Figure 1:
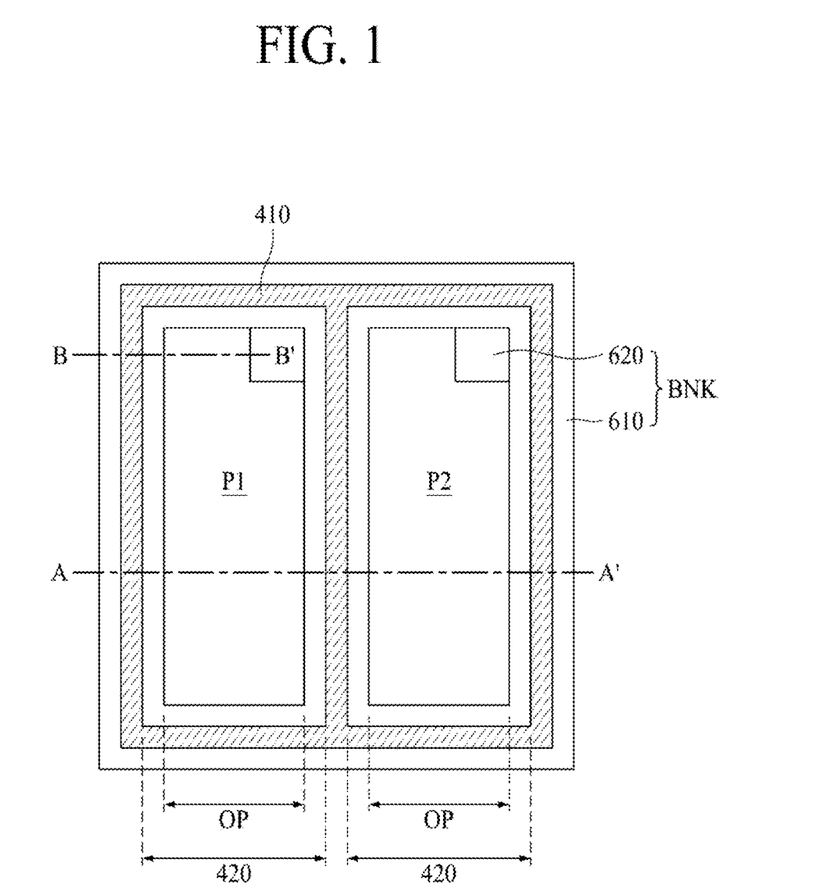
FIG. 1 is a schematic plan view illustrating an example of two adjacent subpixels in an electroluminescence display apparatus according to the first embodiment of the present disclosure.

FIG. 1 is a schematic plan view illustrating an example of two adjacent subpixels P1 and P2 in an electroluminescence display apparatus according to the first embodiment of the present disclosure.

As shown in FIG. 1, in the electroluminescence display apparatus according to the first embodiment of the present disclosure, one subpixel includes an opening OP for emitting light and a bank portion BNK surrounding the opening OP. Each of the two subpixels P1 and P2 may be provided to emit any one of red, green, blue or white light, but is not limited thereto. In addition, the bank portion BNK may include a first bank 610 and a second bank 620. Further, the bank portion BNK may be provided on a planarization layer 400, and the planarization layer 400 may include a first area 410 provided below the first bank 610 and a second area 420 positioned to be adjacent to the first area 410. The second area 420 may be disposed between the first areas 410. Referring to FIG. 1, the first area 410 may be disposed to surround the second area 420. The first area 410 may be provided with a protrusion 415 protruded from an upper surface of the planarization layer 400 in a vertical direction, and the first bank 610 may be formed to cover the protrusion 415. Therefore, a width of the first bank 610 may be greater than that of the first area 410 that includes the protrusion 415.

First Embodiment

Figure 2:
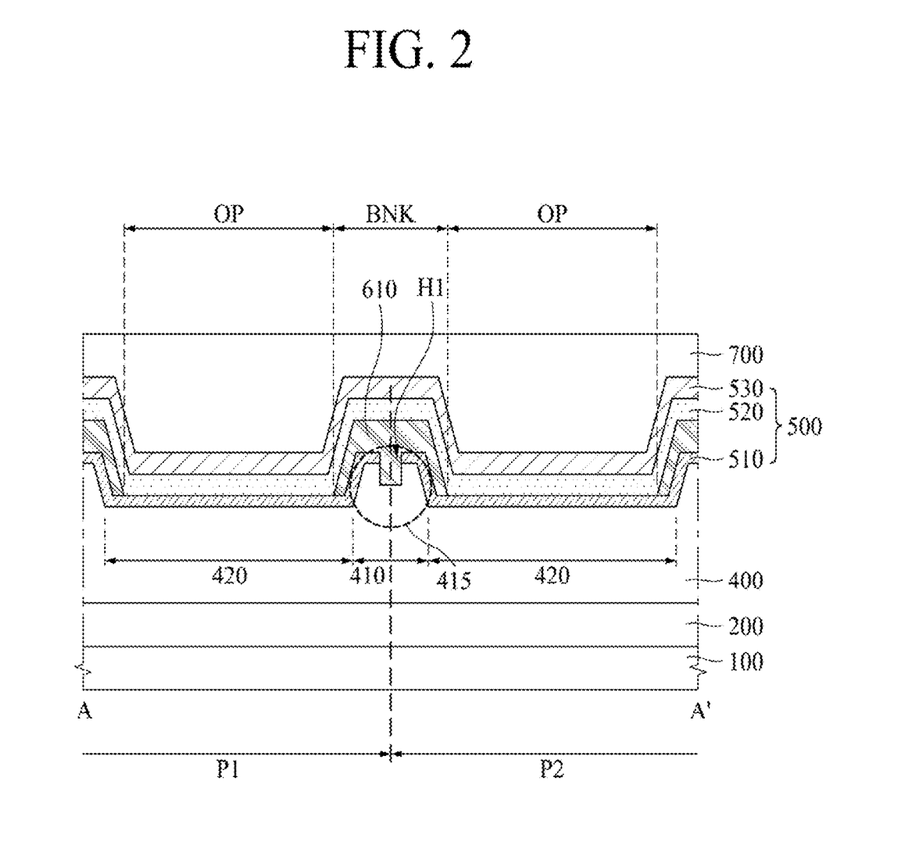
FIG. 2 is a schematic cross-sectional view taken along line A-A' of FIG. 1 in an electroluminescence display apparatus according to the first embodiment of the present disclosure.
Figure 3:
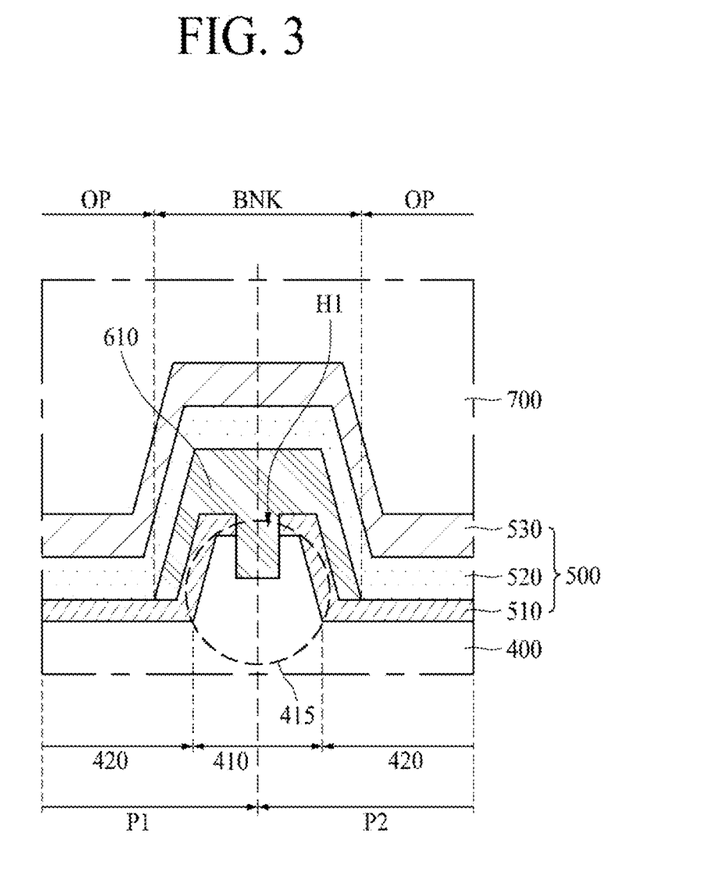
FIG. 3 is a cross-sectional view illustrating a boundary area of two adjacent subpixels in an electroluminescence display apparatus according to the first embodiment of the present disclosure.

FIG. 2 is a schematic cross-sectional view taken along line A-A' of FIG. 1 in an electroluminescence display apparatus according to the first embodiment of the present disclosure, and FIG. 3 is a cross-sectional view illustrating a boundary area of two adjacent subpixels P1 and P2 in an electroluminescence display apparatus according to the first embodiment of the present disclosure.

As shown in FIGS. 2 and 3, the electroluminescence display apparatus according to the first embodiment of the present disclosure may include a substrate 100, a circuit element layer 200, a planarization layer 400, a light emitting element 500, a first bank 610, a second bank 620 and an encapsulation layer 700. The light emitting element 500 may include a first electrode 510, a light emitting layer 520 and a second electrode 530.

The substrate 100 may be made of glass or plastic, but is not limited thereto, and may be made of a semiconductor material such as a silicon wafer. The substrate 100 is provided with first and second subpixels P1 and P2 that emit light of different colors.

The electroluminescence display apparatus according to the first embodiment of the present disclosure is provided in a so-called top emission type in which light is emitted to an upper direction, and thus an opaque material as well as a transparent material may be used as the material of the substrate 100.

The circuit element layer 200 is formed on the substrate 100.

The circuit element layer 200 is provided with a circuit element, which includes various signal lines, a thin film transistor and a capacitor, for each of the subpixels P1 and P2. The signal lines may include a gate line, a data line, a power line and a reference line, and the thin film transistor may include a switching thin film transistor, a driving thin film transistor and a sensing thin film transistor.

The switching thin film transistor is switched in accordance with a gate signal supplied to the gate line to supply a data voltage supplied from the data line to the driving thin film transistor.

The driving thin film transistor is switched in accordance with the data voltage supplied from the switching thin film transistor to generate a data current from a power source supplied from the power line and supply the data current to the first electrode 510.

The sensing thin film transistor serves to sense a threshold voltage deviation of the driving thin film transistor, which causes degradation of image quality, and supplies the current of the driving thin film transistor to the reference line in response to a sensing control signal supplied from the gate line or a separate sensing line.

The capacitor may serve to maintain a data voltage supplied to the driving thin film transistor for one frame, and is connected to each of a gate terminal and a source terminal of the driving thin film transistor.

The planarization layer 400 may be formed on the circuit element layer 200. The planarization layer 400 may compensate for a step difference among the various signal wires, the thin film transistor and the capacitor, which are provided in the circuit element layer 200. The planarization layer 400 may be made of an inorganic insulating material or an organic insulating material. Alternatively, the planarization layer 400 may be made of a layer made of an organic insulating material and a layer made of an inorganic insulating material, which are stacked.

Referring to FIGS. 2 and 3, the planarization layer 400 may include a first area 410 having protrusions 415 protruded from the upper surface of the planarization layer 400 in the vertical direction, and a second area 420 disposed between the protrusions 415. The upper surface of the planarization layer 400 corresponding to the second area 420 may be flat. The display apparatus may include an opening OP corresponding to an area where the first electrode 510 and the light emitting layer 520 of the light emitting element 500 are directly in contact with each other, and a bank portion BNK in which the first bank 610 is disposed. The opening OP may be defined as a light emission area of the light emitting element 500.

Referring to FIG. 2, the protrusions 415 may be formed in a boundary area of two adjacent subpixels P1 and P2. Further, the protrusion 415 may be formed such that a width of an upper surface is smaller than that of a lower surface. Therefore, an angle between a side of the protrusion 415 and the lower surface of the protrusion 415 may be an acute angle.

The first electrode 510 of the light emitting element 500 may be formed on the planarization layer 400. The first electrode 510 may be formed to cover an entire surface of the second area 420 of the planarization layer 400 and a portion of the protrusion 415. In addition, the first electrode 510 may serve as an anode of the electroluminescence display apparatus, and is connected to the driving thin film transistor provided in the circuit element layer 200.

The protrusion 415 may include a first groove H1, and the first electrode 510 may be formed to cover an entire surface of the planarization layer 400. In order to prevent a short between the two adjacent subpixels P1 and P2 from occurring, the first electrode 510 formed in the boundary area of the two adjacent subpixels P1 and P2 or a portion thereof may be removed. Therefore, as shown in FIGS. 2 and 3, the first electrodes 510 may be formed to be spaced apart from each other as much as a predetermined distance in the boundary area of the two adjacent subpixels P1 and P2. Referring to FIGS. 2 and 3, the first electrodes 510 may be spaced apart from each other on the protrusion 415. In the process of etching the first electrode 510, the protrusion 415 of the planarization layer 400 disposed below the first electrode 510 may be etched together. Therefore, an upper area of the protrusion 415 may be partially etched so that the first groove H1 may be provided. In addition, a depth of the first groove H1 may be smaller than a height of the protrusion 415. Also, a lower surface of the first groove H1 may be positioned to be higher than the upper surface of the planarization layer 400 corresponding to the second area 410.

Referring to FIGS. 2 and 3, a thickness of the planarization layer 400 positioned in an area corresponding to the second area 420 may be smaller than that of the planarization layer 400 positioned in an area corresponding to the first area 410. Also, the thickness of the planarization layer 400 positioned in the area corresponding to the second area 420 may be smaller than a distance from the lower surface of the planarization layer 400 positioned in the area corresponding to the protrusion 415 of the first area 410 to the lower surface of the protrusion 415. In addition, the first electrode 510 may not be formed on an inner side and the lower surface of the first groove H1.

Therefore, in the display apparatus according to the first embodiment of the present disclosure, the first electrodes 510 provided in the two adjacent subpixels P1 and P2 may be spaced apart from each other as much as a predetermined distance through the protrusion 415 of the planarization layer 400 and the first groove H1 provided in the protrusion 415. In the related art, a structure is disclosed in which a first electrode 510 provided in each of two adjacent subpixels is spaced apart from another first electrode as much as a predetermined distance on a planarization layer having a planar shape. In contrast, according to the structure of the first embodiment of the present disclosure, since a spare space is additionally formed between the two adjacent subpixels P1 and P2 by the first groove H1 provided in the protrusion 415, a horizontal distance between the first electrodes 510 respectively provided in the two adjacent subpixels P1 and P2 is reduced, and a substantial effective distance between the first electrodes 510 respectively provided in the two adjacent subpixels P1 and P2 may be increased. Therefore, the present disclosure may prevent a short between two adjacent subpixels P1 and P2 from occurring and reduce the distance between the two adjacent subpixels P1 and P2. Therefore, an aperture ratio of the display apparatus according to the first embodiment of the present disclosure may be improved.

The first bank 610 may define a light emission area of each of the two subpixels P1 and P2, and may be formed to overlap the protrusion 415 in the boundary area between the two adjacent subpixels P1 and P2. In detail, the first bank 610 may be formed to cover the first electrode 510 provided on the upper surface and an outer side of the protrusion 415 while filling an inner space of the first groove H1. Also, the first bank 610 may cover a portion of the first electrode 510 positioned in an area adjacent to the protrusion 415. For example, the first bank 610 may cover a portion of the first electrode 510 disposed on the second area 420 adjacent to the protrusion 415.

The first bank 610 may be formed by coating a bank material on the first electrode 510 provided in the first area 410 and the second area 420 and then removing the bank material coated on the second area 420 through a mask process. At this time, a step difference of the planarization layer 400 is formed by the protrusion 415, a thickness of the bank material coated on the outer side of the protrusion 415 adjacent to the upper surface of the protrusion 415 may be greater than that of the bank material coated on the outer side of the protrusion 415 adjacent to the second area 420. That is, a thickness of a portion of the first bank 610 disposed on the outer side of the protrusion 415 adjacent to the upper surface of the protrusion 415 may be greater than that of another portion of the first bank 610 disposed on the outer side of the protrusion 415 adjacent to the second area 420. Therefore, when a mask is disposed on an outer area beyond a design range during removal of the bank material on the second area 420, even though a portion of the bank material coated on the side of the protrusion 415 adjacent to the second area 420 is partially removed, the bank material coated on the outer side of the protrusion 415, which is adjacent to the relatively thick upper surface of the protrusion 415, is not removed, whereby the first bank 610 may be stably formed on the first area 410.

Also, in the related art, a size of the mask was designed so that an area smaller than an area in which etching is required may be etched theoretically, in consideration of an arrangement error of the mask. However, as described above, in the first embodiment of the present disclosure, since the first bank 610 may be stably formed in the first area 410 even through an error occurs in the position where the mask is disposed, the mask may be designed to have a size similar to a theoretical value, whereby an unnecessary margin area of the mask may be minimized.

Therefore, the area where the first bank 610 overlaps the first electrode 510 positioned on the second area 420 may be minimized to increase the light emission area. For example, as the area where the first bank 610 and the first electrode 510 overlap each other is minimized, an area of the opening OP that is directly in contact with the first electrode 510 and the light emitting layer 520 may be increased. Therefore, as the area of the opening OP is increased, a size of the light emission area may be increased.

The first bank 610 may be formed of an organic layer such as an acrylic resin, an epoxy resin, a phenolic resin, a polyamide resin and a polyimide resin. Alternatively, the first bank 610 may be formed of an inorganic layer such as silicon nitride, aluminum nitride, zirconium nitride, titanium nitride, hafnium nitride, tantalum nitride, silicon oxide, aluminum oxide or titanium oxide. Alternatively, the first bank 610 may include a black material to absorb light incident from the outside.

The light emitting layer 520 is formed on the first electrode 510. The light emitting layer 520 may also be formed on the first bank 610. The light emitting layer 520 may be formed in each of the subpixels P1 and P2 and a boundary area between the subpixels P1 and P2.

The light emitting layer 520 may include a hole transporting layer, a light emitting layer and an electron transporting layer. In this case, when a voltage is applied to the first electrode 510 and the second electrode 530, holes and electrons move to the light emitting layer through the hole transporting layer and the electron transporting layer, respectively and are combined with each other in the light emitting layer to emit light. The light emitting layer may further include a hole injecting layer and an electron injecting layer.

The light emitting layer 520 may be provide to emit white (W) light. To this end, the light emitting layer 520 may include a plurality of stacks that emit light of different colors. In detail, the light emitting layer 520 may include a first stack, a second stack and a charge generation layer provided between the first stack and the second stack. The first stack may include, but is not limited to, a first hole transporting layer, a first light emitting layer of yellow green or blue, and a first electron transporting layer, which are sequentially stacked. The charge generation layer may include an N-type charge generation layer that provides electrons to the first stack and a P-type charge generation layer that provides holes to the second stack. The second stack may include, but is not limited to, a second hole transporting layer, a second light emitting layer of blue or yellow-green, and a second electron transporting layer, which are sequentially stacked. In addition, the light emitting layer 520 may be formed of the same material for each of the subpixels P1 and P2, or may have the same thickness.

The second electrode 530 is formed on the light emitting layer 520. The second electrode 530 may serve as a cathode of the electroluminescence display apparatus. In the same manner as the light emitting layer 520, the second electrode 530 may be formed in the subpixels P1 and P2 and the boundary area between the subpixels P1 and P2. Referring to FIGS. 2 and 3, the second electrode 530 may be formed to overlap the first electrode 510 and the first bank 610. As shown in FIG. 2, the second electrodes 530 may be connected to each other without being spaced apart from each other in the subpixels P1 and P2 and the boundary area between the subpixels P1 and P2.

The electroluminescence display apparatus according to the first embodiment of the present disclosure may be provided in a top emission type. In the case that the display apparatus is provided in a top emission type, the second electrode 530 is made of a transparent metal material such as ITO or IZO in order to transmit the light emitted from the light emitting layer 520 to an upper direction. However, the present disclosure is not limited thereto. For example, the electroluminescence display apparatus of the present disclosure may also be provided in a bottom emission type or a dual emission type, and the materials of the first electrode 510 and the second electrode 530 may be changed accordingly.

The encapsulation layer 700 is formed on the second electrode 530 to prevent external moisture from permeated into the light emitting layer 520. The encapsulation layer 700 may be made of an inorganic insulating material, or may be in a structure in which an inorganic insulator and an organic insulator are alternately stacked, but is not limited thereto.

Although not shown, a color filter corresponding to each of the subpixels P1 and P2 may be formed on the encapsulation layer 700, and a protective film may be additionally provided on the color filter.

Second Embodiment

Figure 4:
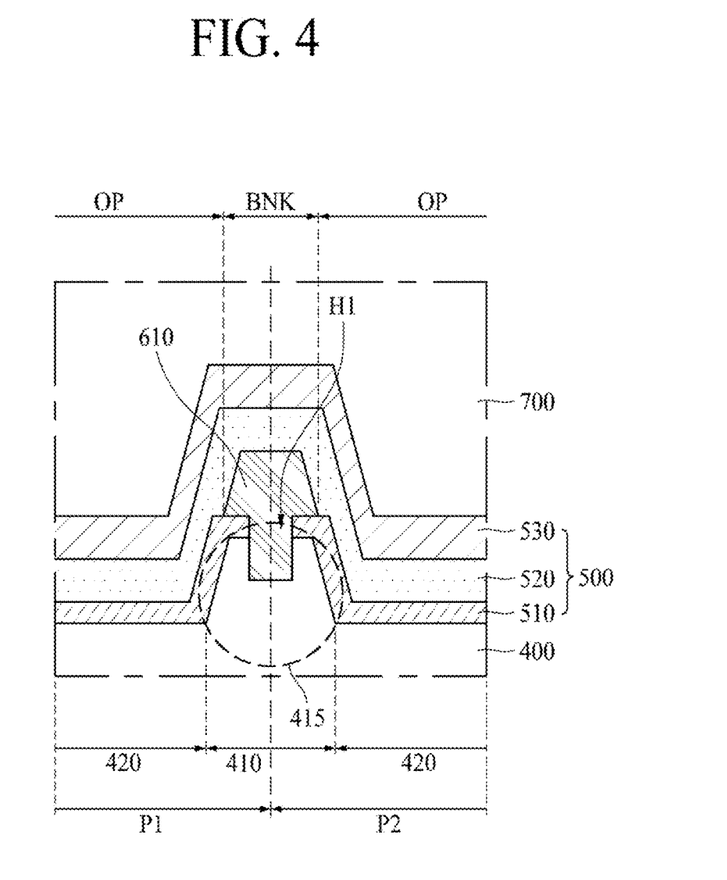
FIG. 4 is a cross-sectional view illustrating a boundary area of two adjacent subpixels in an electroluminescence display apparatus according to the second embodiment of the present disclosure.

FIG. 4 is a cross-sectional view illustrating a boundary area of two adjacent subpixels P1 and P2 in an electroluminescence display apparatus according to the second embodiment of the present disclosure. The display apparatus of FIG. 4 has changed the structure of the first bank 610 from the display apparatus shown in FIGS. 2 and 3. Hereinafter, the changed structure will be described.

FIG. 4 illustrates an electroluminescence display apparatus in which the first bank 610 is formed only on the upper portion of the protrusion 415 of the planarization layer 400. For example, the first bank 610 is not formed on an upper surface of the second area 420 and the outer side of the protrusion 415. The first bank 610 may be formed to overlap the upper surface of the protrusion 415 while filling the inner space of the first groove H1. In addition, the first bank 610 may be formed to cover a portion of the first electrode 510 provided on the upper surface of the protrusion 415.

Therefore, since the first electrode 510 disposed on the outer side of the protrusion 415 is not covered by the first bank 610, the area of the first electrode 510 disposed on the outer side of the protrusion 415 may also be used as the light emission area. Therefore, in the structure of the second embodiment as compared with the structure of the first embodiment, the area of the first electrode 510 covered by the first bank 610 is reduced, and the area of the first electrode 510 that is directly in contact with the light emitting layer 520 is increased, whereby the aperture ratio of the electroluminescence display apparatus may be further increased.

Referring to FIG. 4, as the first bank 610 is formed only on the protrusion 415 of the first area 410, the area where the first bank 610 and the first electrode 510 overlap each other may be minimized. Therefore, as shown in FIG. 4, the size of the opening OP in which the first electrode 510 and the light emitting layer 520 are directly in contact with each other may be increased. Also, as the size of the opening OP is increased, the size of the light emission area may be increased.

Third Embodiment

Figure 5:
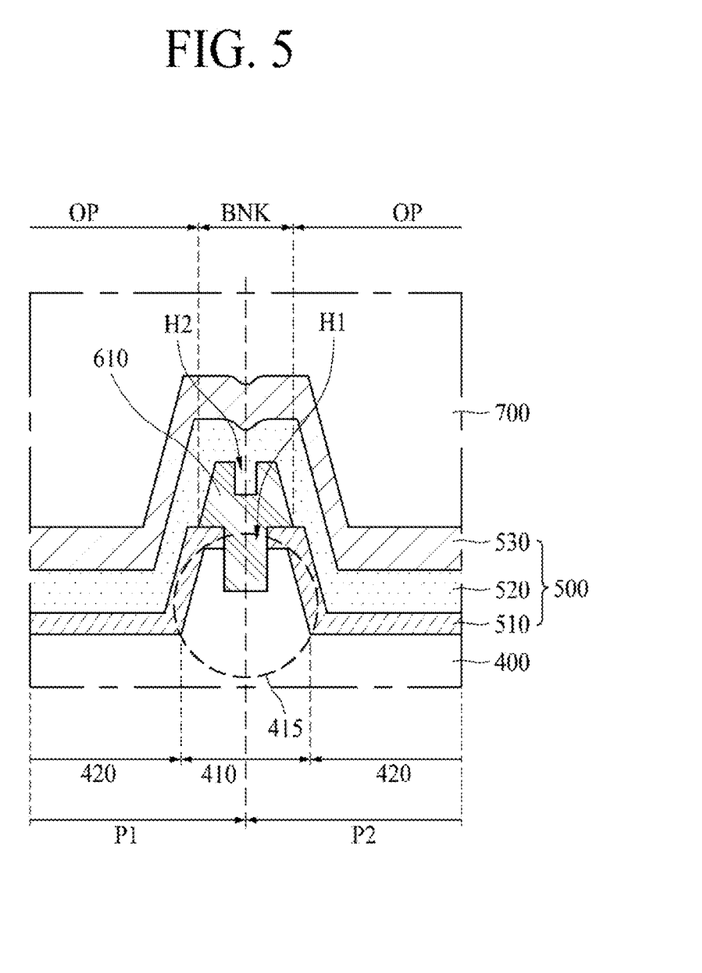
FIG. 5 is a cross-sectional view illustrating a boundary area of two adjacent subpixels in an electroluminescence display apparatus according to the third embodiment of the present disclosure.

FIG. 5 is a schematic cross-sectional view illustrating a boundary area of two adjacent subpixels P1 and P2 in an electroluminescence display apparatus according to the third embodiment of the present disclosure. The display apparatus according to FIG. 5 has changed the structure of the first bank 610 from the display apparatus of FIG. 4. Hereinafter, the changed structure will be described.

FIG. 5 illustrates the first bank 610 having a second groove H2. As described above in the second embodiment, the first bank 610 may not be formed on the upper surface of the second area 420 and on the side of the protrusion 415. The first bank 610 may be formed to overlap a portion of the upper surface of the protrusion 415 while filling the inner space of the first groove H1. In addition, a second groove H2 overlapped with the first groove H1 may be formed on the first bank 610. The second groove H2 may be formed such that the first electrode 510 formed on the upper surface of the protrusion 415 is not exposed to the outside. That is, a depth of the second groove H2 may be smaller than a height of the first bank 610 provided on the upper surface of the protrusion 415. In addition, a portion of the second electrode 530 and the light emitting layer 520 overlapped with the second groove H2 may have a concave shape along a shape of the second groove H2.

As the second groove H2 is formed above the protrusion 415, a spare space may be additionally formed between the first electrodes 510 respectively provided in the two adjacent subpixels P1 and P2. As a result, a distance of a path through which a leakage current flows between the two adjacent subpixels P1 and P2 may be increased. In detail, in the second embodiment, the substantial distance of the path of the leakage current may be regarded as a sum value of a length of two outer sides of the first bank 610 and the width of the upper surface of the first bank 610. In the third embodiment, the distance of the path of the leakage current may be substantially increased as much as a height of two inner sides of the second groove H2 that is additionally provided. Therefore, since a substantial effective distance of the path through which the leakage current flows is more increased in the third embodiment than the second embodiment, the leakage current flowing from one pixel to another pixel may be reduced. It is to be noted that although the second groove H2 is formed in the structure shown in FIG. 5, but embodiments of the present disclosure is not limited thereto. For example, the second groove H2 may also be formed in the structure shown in FIG. 3.

Figure 6:
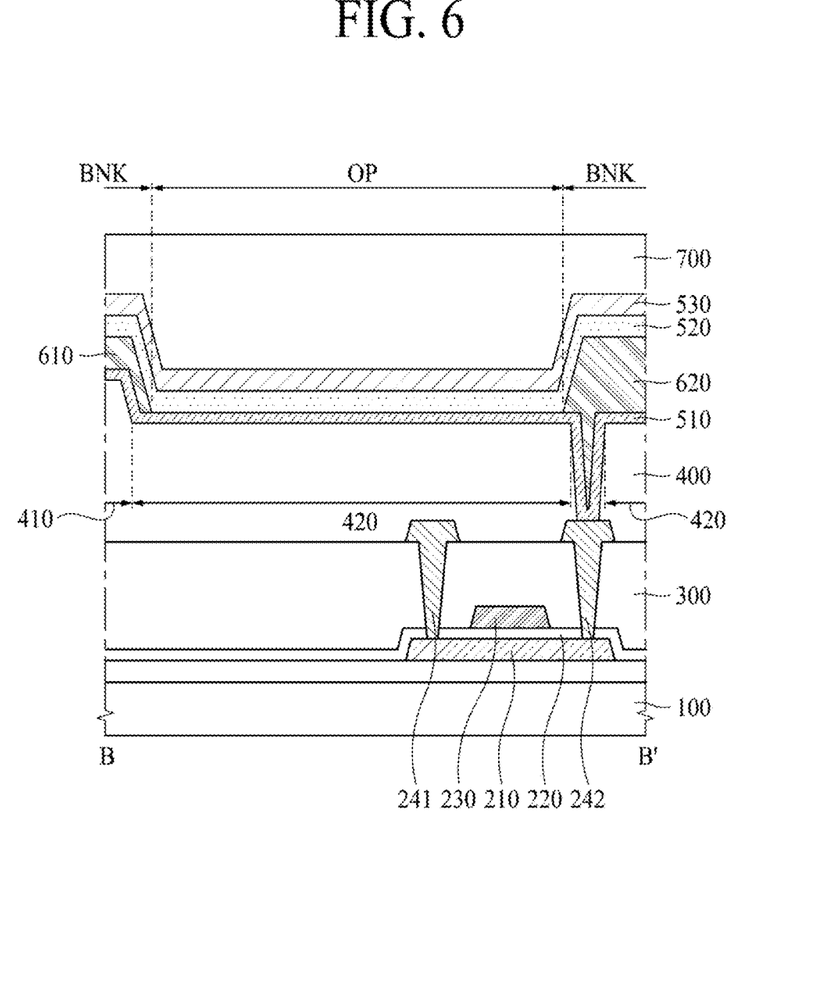
FIG. 6 is a schematic cross-sectional view taken along line B-B' of FIG. 1 in an electroluminescence display apparatus according to the first embodiment of the present disclosure.

FIG. 6 is a schematic cross-sectional view taken along line B-B' of FIG. 1 in an electroluminescence display apparatus according to the first embodiment of the present disclosure. The display apparatus according to FIG. 6 may include the same elements as the substrate 100, the circuit element layer 200, the planarization layer 400, the light emitting element 500, the first bank 610, the second bank 620 and the encapsulation layer 700 of the display apparatus according to FIG. 2.

As noted from FIG. 6, the driving thin film transistor TFT of the circuit element layer 200 and the interlayer insulating layer 300 are shown in detail.

The thin film transistor TFT may include an active layer 210, a gate insulating layer 220, a gate electrode 230, a source electrode 241 and a drain electrode 242.

The active layer 210 is provided on the substrate 100. The active layer 210 may be made of an oxide semiconductor such as In—Ga—Zn—O (IGZO) but is not limited thereto, and may be made of a silicon-based semiconductor.

The gate insulating layer 220 may be formed on the active layer 210 to insulate the gate electrode 230 from the active layer 210. The gate insulating layer 220 may be made of an inorganic insulating material such as silicon oxide or silicon nitride or an organic insulating material such as photo acryl or benzocyclobutene (BCB), but is not limited thereto.

The gate electrode 230 is formed on the gate insulating layer 220. The gate electrode 230 may be made of a metal such as molybdenum (Mo), aluminum (Al), chromium (Cr), gold (Au), titanium (Ti), nickel (Ni), neodymium (Nd) and copper (Cu) or their alloy, or may be made of a single layer of the metal or alloy or multiple layers of two or more layers.

The interlayer insulating layer 300 is formed on the gate insulating layer 220 and the gate electrode 230. The interlayer insulating layer 300 may be made of an inorganic insulating material such as silicon oxide or silicon nitride or an organic insulating material such as photo acryl or benzocyclobutene (BCB), but is not limited thereto.

The source electrode 241 and the drain electrode 242 face each other and are provided on the interlayer insulating layer 300. In addition, each of the source electrode 241 and the drain electrode 242 may be connected to the active layer 210 through a contact hole formed in the interlayer insulating layer 300. The source electrode 241 and the drain electrode 242 may be made of a metal such as molybdenum (Mo), aluminum (Al), chromium (Cr), gold (Au), titanium (Ti), nickel (Ni), neodymium (Nd) and copper (Cu) or their alloy, or may be made of a single layer of the metal or alloy or multiple layers of two or more layers.

The driving thin film transistor TFT according to the first embodiment of the present disclosure is provided in a top gate structure in which the gate electrode 230 is formed on the active layer 210, but may be provided in a bottom gate structure in which the gate electrode 230 is formed below the active layer 210.

The planarization layer 400 is provided on the interlayer insulating layer 300, the source electrode 241 and the drain electrode 242, and the first electrode 510 is formed on the planarization layer 400. The first electrode 510 may be connected to the source electrode 241 or the drain electrode 242 through the contact hole, and FIG. 6 illustrates a structure in which the first electrode 510 is connected to the drain electrode 242.

The second bank 620 may be formed on the first electrode 510 connected with the drain electrode 242. The second bank 620 may be formed to fill a contact hole area of the planarization layer 400, in which the first electrode 510 and the drain electrode 242 are connected with each other. A thickness of the first electrode 510 formed on an inner side of the contact hole may be smaller than a thickness of the first electrode 510 positioned in the second area 420. Therefore, resistance of the first electrode 510 formed on the inner side of the contact hole may be greater than that of the first electrode 510 positioned in the second area 420. Therefore, brighter light may be emitted from the contact hole area, so that the display apparatus may emit light non-uniformly. In order to avoid this problem, the second bank 620 may be formed.

According to the present disclosure, the following advantageous effects may be obtained.

According to the present disclosure, as the groove is formed the protrusion provided in the planarization layer, the interval between adjacent pixel electrodes may be minimized, whereby the aperture ratio of the display apparatus may be improved.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
a substrate having a plurality of subpixels;
a planarization layer provided on the substrate, including a first area in which protrusions are formed and a second area positioned between the protrusions;
a first electrode provided on the planarization layer;
a bank provided on the first electrode;
a light emitting layer provided on the first electrode;
a second electrode provided on the light emitting layer; and
a first groove provided on an upper portion of the protrusion,
wherein the protrusion is provided between two adjacent subpixels,
wherein the first electrode covers a portion of the protrusion and the second area, and
wherein the bank is provided only on the upper portion of the protrusion.

2. The display apparatus of claim 1, wherein the protrusion is provided in a boundary area of the two adjacent subpixels.

3. The display apparatus of claim 1, wherein the plurality of subpixels includes a first subpixel and a second subpixel adjacent to each other, and
wherein the first electrode of the first subpixel and the first electrode of the second subpixel are spaced apart from each other on the protrusion.

4. The display apparatus of claim 1, wherein a thickness of the planarization layer in an area corresponding to the second area is smaller than that of the planarization layer in an area corresponding to the first area.

5. The display apparatus of claim 1, wherein an upper surface of the second area of the planarization layer is flat.

6. The display apparatus of claim 1, wherein an angle between an outer side of the protrusion and a lower surface of the protrusion forms an acute angle.

7. The display apparatus of claim 1, wherein the first electrode is not formed on an inner side and a lower surface of the first groove.

8. The display apparatus of claim 1, wherein a depth of the first groove is smaller than a height of the protrusion.

9. The display apparatus of claim 1, wherein a lower surface of the first groove is disposed at a position higher than an upper surface of the second area of the planarization layer.

10. The display apparatus of claim 1,
wherein the bank is formed to overlap the protrusion while filling the inside of the first groove.

11. The display apparatus of claim 10, wherein the bank includes a first bank overlapping the protrusion and a second bank formed to fill a contact hole area of the planarization layer, in which the first electrode and a drain electrode of a driving thin film transistor are connected with each other.

12. The display apparatus of claim 10, further comprising a second groove provided on an upper portion of the bank.

13. The display apparatus of claim 12, wherein portions of the second electrode and the light emitting layer overlapped with the second groove have a concave shape along a shape of the second groove.

14. The display apparatus of claim 12, wherein the second groove is formed to overlap the first groove.

15. The display apparatus of claim 12, wherein a depth of the second groove is smaller than a height of the bank provided on an upper surface of the protrusion.

16. The display apparatus of claim 1, wherein the bank is not provided on an upper surface of the second area and an outer side of the protrusion.

* * * * *